(12) United States Patent
Komatsu et al.

(10) Patent No.: US 9,384,902 B2
(45) Date of Patent: Jul. 5, 2016

(54) SILICON DIOXIDE SOLAR CELL

(75) Inventors: Nobuaki Komatsu, Tokyo (JP); Tomoko Ito, Tokyo (JP); Hiroki Nagai, Tokyo (JP); Shin-ichiro Nanjo, Tokyo (JP)

(73) Assignee: INTERNATIONAL FRONTIER TECHNOLOGY LABORATORY, INC., Tokyo (JP)

( * ) Notice: Subject to any disclaimer, the term of this patent is extended or adjusted under 35 U.S.C. 154(b) by 22 days.

(21) Appl. No.: 14/004,283

(22) PCT Filed: Mar. 12, 2012

(86) PCT No.: PCT/JP2012/056291
§ 371 (c)(1),
(2), (4) Date: Nov. 20, 2013

(87) PCT Pub. No.: WO2012/124655
PCT Pub. Date: Sep. 20, 2012

(65) Prior Publication Data
US 2014/0060630 A1    Mar. 6, 2014

(30) Foreign Application Priority Data

Mar. 11, 2011  (JP) .................................. 2011-054609
Mar. 29, 2011  (JP) .................................. 2011-073152
Apr. 15, 2011  (JP) .................................. 2011-091389
Feb. 29, 2012  (JP) .................................. 2012-044753

(51) Int. Cl.
*H01G 9/20*    (2006.01)

(52) U.S. Cl.
CPC .......... *H01G 9/2018* (2013.01); *H01G 9/2004* (2013.01); *H01G 9/2027* (2013.01);
(Continued)

(58) Field of Classification Search
CPC . H01G 9/2004; H01G 9/2027; H01G 9/2031; H01G 9/2072; H01G 9/2018; H01G 9/2059
See application file for complete search history.

(56) References Cited

U.S. PATENT DOCUMENTS

2010/0288340 A1* 11/2010 Park et al. ..................... 136/252
2011/0315203 A1* 12/2011 Hayase ................ H01G 9/2072
                                                                136/255

FOREIGN PATENT DOCUMENTS

JP    2001-243995 A    9/2001
JP    2002-170602 A    6/2002
(Continued)

OTHER PUBLICATIONS

JP 2011-028918 A online machine translation, translated on Nov. 4, 2014.*
(Continued)

*Primary Examiner* — Golam Mowla
(74) *Attorney, Agent, or Firm* — Westerman, Hattori, Daniels & Adrian, LLP (57) ABSTRACT

In order to increase the generation efficiency of a silicon dioxide solar cell, two conductive substrates are arranged so that the conductive surfaces thereof face each other, at least one of the substrates is disposed upon the substrate facing the light entry-side substrate, and an electrolyte is filled between the silicon dioxide particles compact and the light entry-side substrate. Silicon dioxide solar cells having this configuration exhibit a significantly increased short circuit current and open circuit voltage in comparison to solar cells in which the silicon dioxide and the electrolyte are mixed. This configuration can further be improved by disposing a titanium dioxide solar cell or a dye-sensitized titanium dioxide solar cell upon the light entry-side substrate to further increase the short circuit current and the open circuit voltage.

7 Claims, 11 Drawing Sheets

(52) U.S. Cl.
CPC ............ *H01G 9/2031* (2013.01); *H01G 9/2059* (2013.01); *H01G 9/2072* (2013.01); *H01L 2251/306* (2013.01); *Y02E 10/542* (2013.01)

(56) References Cited

FOREIGN PATENT DOCUMENTS

| JP | 2004-290747 A | 10/2004 |
| JP | 2004-290748 A | 10/2004 |
| JP | 2006-244830 A | 9/2006 |
| JP | 2007-018809 A | 1/2007 |
| JP | 2008-257893 A | 10/2008 |
| JP | 2011-028918 A | 2/2011 |
| WO | 2005/089941 A1 | 9/2005 |
| WO | WO 2010/103759 A1 * | 9/2010 ............. H01L 31/04 |
| WO | 2011/049156 A1 | 4/2011 |

OTHER PUBLICATIONS

International Search Report dated May 15, 2012, issued in corresponding application No. PCT/JP2012/056291.

* cited by examiner

SILICON DIOXIDE SOLAR CELL

TECHNICAL FIELD

The present invention relates to a solar cell, more particularly to a silicon dioxide solar cell using silicon dioxide.

BACKGROUND ART

A dry-type solar cell using a semiconductor, such as silicon, is on the stage of being practically used. A semiconductor solar cell has high generation efficiency, but is expensive due to the use of a highly purified material.

As a relatively inexpensive solar cell, there is a wet-type solar cell using titanium dioxide ($TiO_2$) and an electrolyte.

A titanium dioxide solar cell arrangement is described with reference to FIG. 1.

Figure 1:
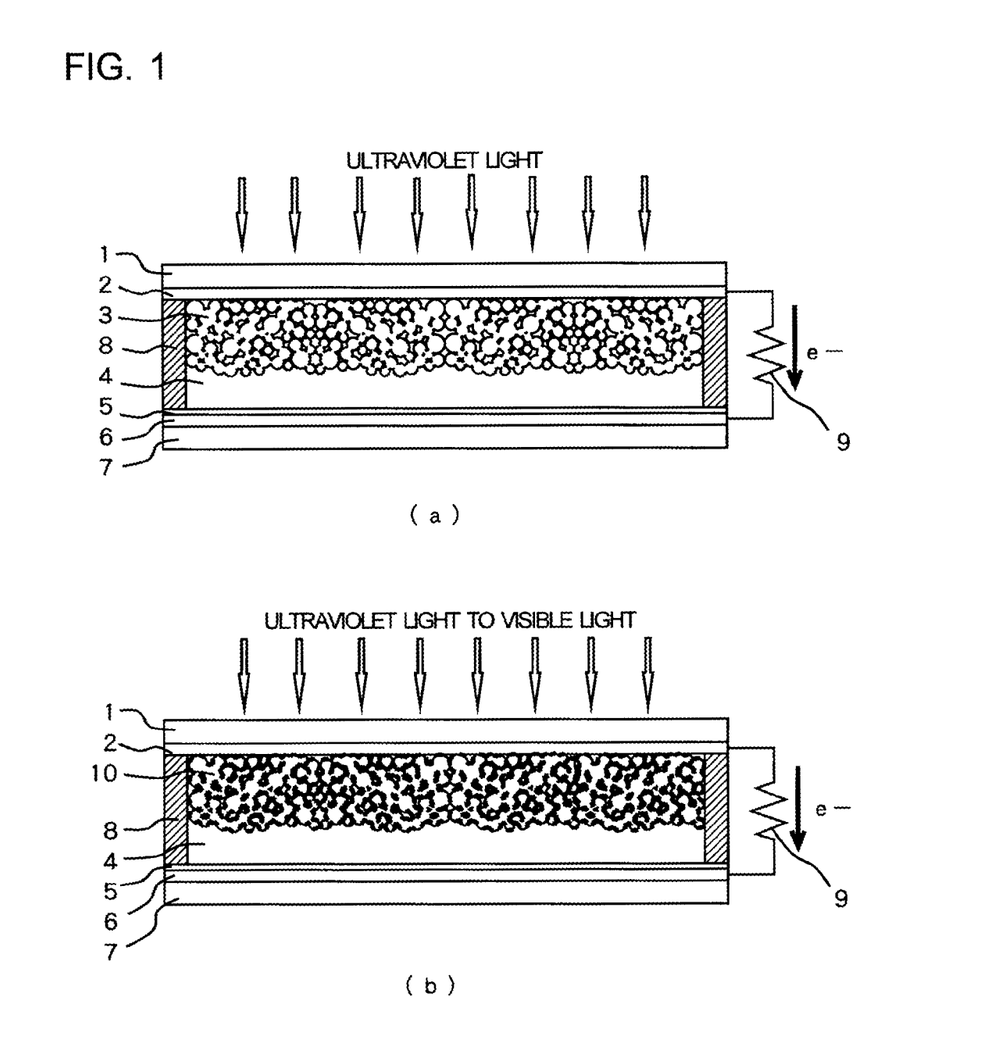
FIG. 1 shows diagrammatic views of a conventional porous titanium dioxide solar cell and dye-sensitized porous titanium dioxide solar cell.

FIG. 1(a) shows a titanium dioxide solar cell having a basic arrangement, and FIG. 1(b) shows an improved titanium dioxide solar cell called a dye sensitized type. In the titanium dioxide solar cell having the basic arrangement shown in FIG. 1(a), numeral 1 represents a glass substrate forming on one surface thereof a transparent conductive layer 2 made of FTO or the like, and which serves as a photoelectrode. Numeral 3 represents a porous titanium dioxide sintered material. Numeral 4 represents an electrolytic solution, and an iodine electrolyte having iodine dissolved in an aqueous potassium iodide solution is generally used. Numeral 5 represents a platinum counter electrode which is formed on a glass substrate 7 having formed thereon a conductive layer 6 made of FTO or the like. Numeral 8 represents a sealing material, and numeral 9 represents an external load, such as a resistor.

The incident light which has passed through the transparent conductive layer 2 on the glass substrate 1 is absorbed by the porous titanium dioxide sintered material 3. The porous titanium dioxide sintered material 3 which has absorbed the light is electronically changed from the ground state to an excited state, and the excited electrons are caused to go out of the transparent conductive layer 2 due to diffusion, and introduced through the load 9 from the transparent conductive layer 6 to the platinum counter electrode 5.

However, the light which the titanium dioxide can utilize in electric generation is only ultraviolet light having the wavelength of 380 nm or less, and the ultraviolet light in this range of wavelength is only 4% of the sunlight, and thus the sunlight utilization efficiency is 4% at most, practically 1%, and therefore, this solar cell using titanium dioxide exhibits extremely poor utilization efficiency of the sunlight.

For removing the drawback of titanium dioxide that the usable wavelength range of light is narrow, there has been known a dye sensitized solar cell (DSSC) which has sintered porous titanium dioxide having a ruthenium complex dye adsorbed thereon, and which thereby can use light in the visible light region that is longer in wavelength than the ultraviolet light.

The basic arrangement of the dye sensitized solar cell is described with reference to FIG. 1(b).

In this figure, numeral 1 represents a glass substrate forming on one surface thereof a transparent conductive layer 2 made of FTO or the like. Numeral 3 represents a porous titanium dioxide sintered material having a ruthenium complex dye adsorbed on the porous surface thereof. Numeral 4 represents an electrolytic solution, and an iodine electrolyte having iodine dissolved in an aqueous potassium iodide solution is generally used. Numeral 5 represents a platinum counter electrode which is formed on a glass substrate 7 having formed thereon a conductive layer 6 made of FTO or the like. Numeral 8 represents a sealing material, and numeral 9 represents an external load, such as a resistor.

The incident light which has passed through the FTO transparent conductive layer 2 on the glass substrate 1 is absorbed by the ruthenium complex dye adsorbed on the porous surface of the porous titanium dioxide sintered material 3. The ruthenium complex dye which has absorbed the light is electronically changed from the ground state to an excited state, and electrons in the excited state in the ruthenium complex dye are injected into the porous titanium dioxide sintered material 3, so that the ruthenium complex dye changes to an oxidation state. In this instance, for effectively injecting the excited electrons in the ruthenium complex dye into the porous titanium dioxide sintered material 3, the excitation energy level of the ruthenium complex dye must be lower than the conduction band energy level of the porous titanium dioxide sintered material 3 which is a semiconductor. The electrons injected into the porous titanium dioxide sintered material 3 are caused to go out of the transparent conductive layer 2 due to diffusion, and introduced through the load 9 to the platinum counter electrode 5. On the other hand, the oxidized ruthenium complex dye receives electrons from iodine contained in the iodine electrolyte 4 and is changed back to the ruthenium complex dye in the ground state.

A dye sensitized solar cell having the above-mentioned arrangement theoretically has sunlight utilization efficiency of 30%, but, practically 10% at most.

Titanium dioxide has a photocatalytic function, and, as a material similarly having the photocatalytic function, fused quartz treated with halogen acid is described in JP-A-2004-290748 and JP-A-2004-290747.

As a material similarly having a photocatalytic action, synthetic quartz treated with hydrofluoric acid is described in International Patent Application Publication No. WO2005/089941.

The synthetic quartz photocatalyst functions as a photocatalyst in a wavelength range of 200 to 800 nm which is further wider than the range for the photocatalyst using fused quartz as a raw material described in JP-A-2004-290748 and JP-A-2004-290747.

The present inventors have found that synthetic quartz or fused quartz, which is silicon dioxide, has a photovoltaic ability, and have proposed the silicon dioxide solar cell described in International Patent Application Publication No. WO2011/049156.

The solar cell described in International Patent Application Publication No. WO2011/049156 is described with reference to FIG. 2.

Figure 2:
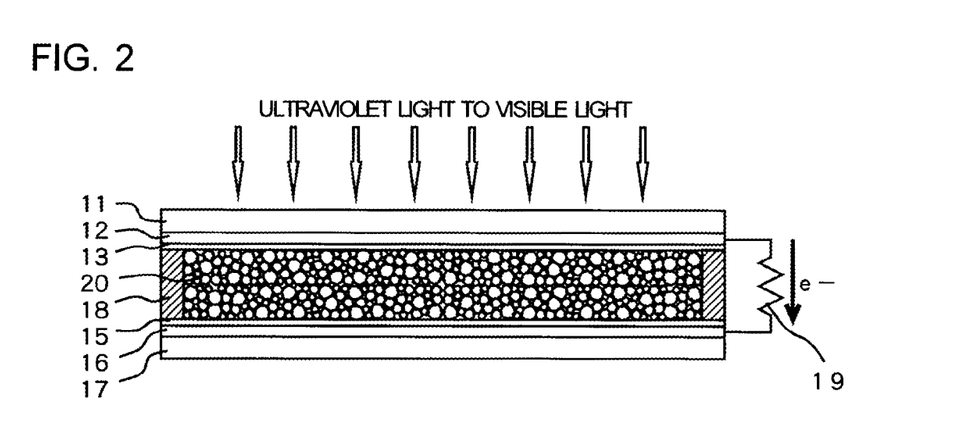
FIG. 2 shows a diagrammatic view of the prior art silicon dioxide solar cell.

In FIG. 2, numerals 11 and 17 represent 30 mm×30 mm glass substrates having a transparent conductive layer FTO (fluorine-doped tin oxide) layer 12 and an FTO layer 16, respectively, formed thereon, and the solar cell has a size of 20 mm×20 mm.

An n-type semiconductor layer 13 of zinc oxide (ZnO), titanium dioxide ($TiO_2$), or the like is formed on the FTO layer on the light incident side, and a platinum layer 15 is formed on the FTO layer 16 positioned opposite to the FTO layer 12 on the light incident side.

A solar cell material 20 having the thickness of 0.15 to 0.20 mm and having a mixture of glass containing $SiO_2$ and an electrolyte is sealed between the n-type semiconductor layer 25 and the platinum layer 26.

With respect to the solar cell material 27, there is used one which is obtained by immersing glass particles containing $SiO_2$ or the like in a 5% aqueous solution of hydrofluoric acid for 5 minutes, washing the particles with water, drying them, and pulverizing the resultant particles so that the particle diameter becomes 0.2 mm or less.

The electrolyte is obtained by adding 0.1 mol of LiI, 0.05 mol of $I_2$, 0.5 mol of 4-tert-butylpyridine, and 0.5 mol of tetrabutylammonium iodide to 0.5 mol acetonitrile solvent.

While the details of the mechanism of silicon dioxide photocell are unclear, there is a phenomenon that when silicon dioxide is irradiated with the sunlight having the wavelength of 200 to 800 nm, the light is absorbed and electrons flow from the electrode on the silicon dioxide side toward the counter electrode through a load, in other words, a current flows from the counter electrode toward the electrode on the silicon dioxide side.

As a solar cell material, synthetic quartz is the most useful, but fused quartz glass, soda-lime glass, non-alkali glass, or borosilicate glass can also be used in electric generation.

The short-circuit current and open circuit voltage obtained when irradiated with a light from a fluorescent lamp at 15,000 to 19,000 lux are as follows:

|  | short-circuit current | open circuit voltage |
| --- | --- | --- |
| Synthetic quartz: | 0.5 µA | 35 mV |
| Fused quartz glass: | 0.5 µA | 30 mV |
| Soda-lime glass: | 0.3 µA | 15 mV |
| Non-alkali glass: | 0.4 µA | 30 mV |
| Borosilicate glass: | 0.3 µA | 14 mV |

Further, even with respect to the silicon dioxide composition which is not treated with hydrofluoric acid, the following short-circuit current and open circuit voltage have been obtained.

|  | short-circuit current | open circuit voltage |
| --- | --- | --- |
| Synthetic quartz: | 0.1 µA | 3 mV |
| Fused quartz glass: | 0.2 µA | 3 mV |
| Soda-lime glass: | 0.1 µA | 5 mV |
| Non-alkali glass: | 0.1 µA | 5 mV |
| Borosilicate glass: | 0.2 µA | 12 mV |

PRIOR ART REFERENCES

Document 1: JP-A-2004-290748
Document 2: JP-A-2004-290747
Document 3: International Patent Application Publication No. WO2005/089941
Document 4: International Patent Application Publication No. WO2011/049156

DISCLOSURE OF THE INVENTION

Object of the Invention

An object of the invention according to the present application is to obtain a solar cell which exhibits high light utilization efficiency.

The present inventors have found that by pulverizing the halogen-acid-treated synthetic quartz particles or fused quartz particles, further excellent solar cell function is exhibited.

The inventors have found that the synthetic quartz or glass pulverized into the powder size close to the light wavelength exhibits further excellent function as a solar cell material.

The inventors have found that the silicon dioxide solar cell can also utilize the infrared light in electric generation.

In the invention of the present application, based on the above findings, there is obtained a solar cell having a combination of a silicon dioxide solar cell and a titanium dioxide solar cell in a tandem configuration, wherein power is extracted from both the electrodes on the silicon dioxide solar cell side and on the titanium dioxide solar cell side, making it possible to utilize the light in all the region from the ultraviolet light through the infrared light in the electric generation.

When the titanium dioxide solar cell in the tandem configuration is of a dye sensitized type, the range of the usable light is widened.

The pulverized silicon dioxide powder particles may diffuse through the electrolyte and adhere to the sensitizing dye, causing the function of the sensitizing dye to be poor.

In this case, a separator is provided between the silicon dioxide solar cell portion and the dye-sensitized titanium dioxide solar cell portion.

One aspect of the present application is a solar cell having a combination of a silicon dioxide solar cell and a dye-sensitized titanium dioxide solar cell in a tandem configuration, wherein the silicon dioxide solar cell comprises synthetic quartz particles treated with halogen acid which are crystalline, or quartz glass, non-alkali glass, borosilicate glass, soda-lime glass, or the like treated with halogen acid which are amorphous, and an iodine electrolyte.

One aspect of the present application is a solar cell having a combination of a dye sensitized solar cell and a silicon dioxide solar cell in a tandem configuration, wherein the dye sensitized solar cell comprises titanium dioxide having adsorbed thereon a dye, such as a ruthenium dye, and an iodine electrolyte, and the silicon dioxide solar cell uses synthetic quartz particles treated with halogen acid which are crystalline, or quartz glass, non-alkali glass, borosilicate glass, soda-lime, or the like treated with halogen acid which are amorphous.

One aspect of the present application is a solar cell having a combination of a dye sensitized solar cell and a silicon dioxide solar cell in a tandem configuration, wherein the dye sensitized solar cell comprises porous titanium dioxide having adsorbed thereon a dye, such as a ruthenium dye, and an iodine electrolyte, and the silicon dioxide solar cell uses synthetic quartz particles treated with halogen acid which are crystalline, or quartz glass, non-alkali glass, borosilicate glass, soda-lime glass, or the like treated with halogen acid which are amorphous, and the porous titanium dioxide is further combined with pulverized silicon dioxide.

Specific characteristic features of the silicon dioxide solar cell of the invention of the present application are as follows.

Two substrates having electrical conductivity are arranged so that the respective conductive surfaces of the substrates are facing each other, wherein at least one of the substrates is a transparent substrate on the light incident side, and a silicon dioxide particles compact is disposed on the substrate arranged facing the substrate on the light incident side, and the space between the silicon dioxide particles compact and the substrate on the light incident side is filled with an electrolyte.

Two substrates having electrical conductivity are arranged so that the respective conductive surfaces of the substrates are facing each other, wherein at least one of the substrates is a transparent substrate on the light incident side, and a silicon dioxide particles compact is disposed on the substrate facing the substrate on the light incident side, the space between the silicon dioxide particles compact and the substrate on the light incident side is filled with an electrolyte, and further a porous titanium dioxide sintered material is disposed on the substrate on the light incident side.

Two substrates having electrical conductivity are arranged so that the respective conductive surfaces of the substrates are facing each other, wherein at least one of the substrates is a transparent substrate on the light incident side, and a silicon dioxide particles compact is disposed on the substrate facing the substrate on the light incident side, the space between the silicon dioxide particles compact and the substrate on the light incident side is filled with an electrolyte, and further a porous titanium dioxide sintered material having a sensitizing dye adsorbed thereon is disposed on the substrate on the light incident side.

Effects of the Invention

In the invention of the present application, by employing a combination of a silicon dioxide solar cell and a titanium dioxide solar cell in a tandem configuration, power is extracted from both the electrodes on the titanium dioxide solar cell side and the silicon dioxide solar cell side.

By virtue of the above-mentioned configuration, the light in all the region from the ultraviolet light through the infrared light can be utilized in the electric generation.

When the titanium dioxide solar cell in the tandem configuration is of a dye sensitized type, the range of the usable light is widened.

The solar cell according to the present application can achieve increased photo-generation than that obtained by a conventional solar cell comprising porous titanium dioxide and an iodine electrolyte.

The dye sensitized solar cell according to the present application can achieve increased photo-generation than that obtained by a conventional dye sensitized solar cell comprising titanium dioxide having a ruthenium sensitizing dye adsorbed thereon and an iodine electrolyte.

The dye-sensitized titanium dioxide solar cell according to the present application can achieve a short-circuit current of 2,860 μA at most, and the electromotive ability has been drastically increased, as compared to 2,510 μA of a conventional dye-sensitized titanium dioxide solar cell.

DESCRIPTION OF EMBODIMENTS

Hereinbelow, modes for carrying out the invention will be described with reference to the accompanying drawings.

Embodiment 1

Figure 3:
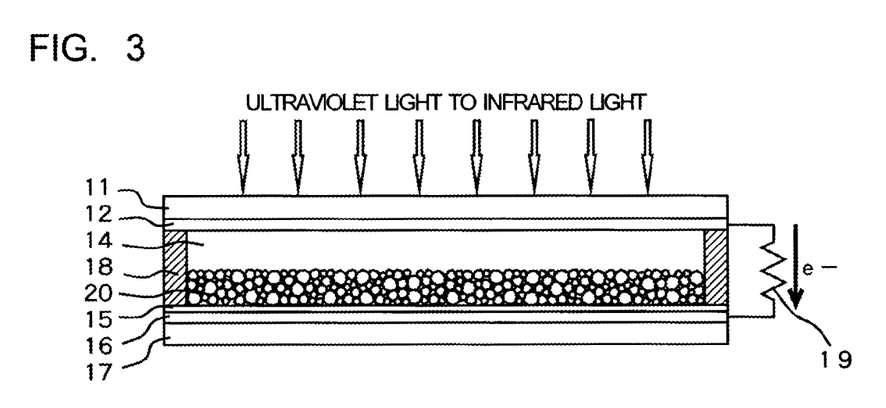
FIG. 3 shows a diagrammatic view of the silicon dioxide solar cell according to Embodiment 1.

FIG. 3 shows the silicon dioxide solar cell according to Embodiment 1, which is obtained by improving the silicon dioxide solar cell shown in FIG. 2.

In FIG. 3, numerals 11 and 17 represent glass substrates having a transparent conductive layer 12 made of FTO or the like and a transparent conductive layer 16 made of FTO or the like, formed thereon respectively. The transparent conductive layer 12 and transparent conductive layer 16 function as an electrode for extracting electric power. The glass substrates 11 and 12 are arranged so that the transparent conductive layer 12 on the glass substrate 11 and the FTO layer 16 on the glass substrate 17 are facing each other.

Numeral 20 represents a silicon dioxide ($SiO_2$) calcinated material having the thickness of 0.15 to 0.20 mm, which is disposed on the glass substrate 17 on the side where light does not enter.

On the transparent conductive layer 16 on the silicon dioxide side, a platinum (Pt) layer 15 is formed as an electrode for extracting charges.

Numeral 14 represents an electrolyte. In contrast to the prior art silicon dioxide solar cell shown in FIG. 2 in which the electrolyte is mixed into silicon dioxide, the space between the silicon dioxide calcinated material 20 and the glass substrate 11 on the light incident side is filled with the electrolyte.

Numeral 18 represents a sealing material, and numeral 19 represents an external load.

In the electrolyte 14, there used an electrolyte obtained by adding 0.1 mol of LiI, 0.05 mol of $I_2$, 0.5 mol of 4-tert-butylpyridine, and 0.5 mol of tetrabutylammonium iodide to 0.5 mol acetonitrile solvent.

With respect to the silicon dioxide calcinated material 20, there is used a material obtained by immersing synthetic quartz which is crystalline silicon dioxide, or glass particles of quartz glass, non-alkali glass, borosilicate glass, soda-lime, or the like, which are amorphous, in a 5% aqueous solution of hydrofluoric acid for 5 minutes, washing the particles with water, drying them, and then pulverizing the resultant particles so that the particle diameter becomes 500 nm or less.

With respect to the aqueous solution in which the silicon dioxide is immersed, hydrochloric acid can be used as halogen acid other than hydrofluoric acid.

The synthetic quartz particles having the particle diameter of about 0.2 to 0.5 mm can be used, and those which are not calcined but are mixed with ethanol and applied onto the platinum electrode 15 and dried can also be used.

The light entered from the light incident side glass substrate 11 enters the silicon dioxide 20 to cause electric generation.

Using a solar simulator, the solar cell according to Embodiment 1 was irradiated with the light at 1 kw/m² which is a solar constant. When the particle diameter of the synthetic quartz was 0.2 mm or less, a short-circuit current of 85 μA and an open circuit voltage of 470 mV were obtained. When the particle diameter was 500 nm or less, a short-circuit current of 348 μA and an open circuit voltage of 620 mV were obtained.

These values have been drastically increased with respect to both the short-circuit current and open circuit voltage, as compared to the values of the prior art silicon dioxide solar cell shown in FIG. 2, although the measurement conditions are different from those for the embodiment.

In addition, with respect to the synthetic quartz solar cell which is a silicon dioxide solar cell, the present inventors measured a short-circuit current at the illuminance almost equivalent to that of direct sunlight using a 300 W incandescent lamp which is a light source containing no ultraviolet region component. As a result, an open circuit voltage of 400 mV and a short-circuit current of 0.5 μA were obtained, which has confirmed that the silicon dioxide solar cell causes electric generation using solely the infrared light.

From the above, it is apparent that the silicon dioxide solar cell causes electric generation also using the light containing no ultraviolet region component, where it is impossible for a dye-sensitized titanium dioxide solar cell which is a typical wet-type solar cell.

Embodiment 2

Embodiment 2 is described with reference to FIG. 4.

The solar cell according to Embodiment 2 is a combination of the silicon dioxide solar cell according to Embodiment 1 and the conventional titanium dioxide solar cell shown in FIG. 1(a) in a tandem configuration.

Figure 4:
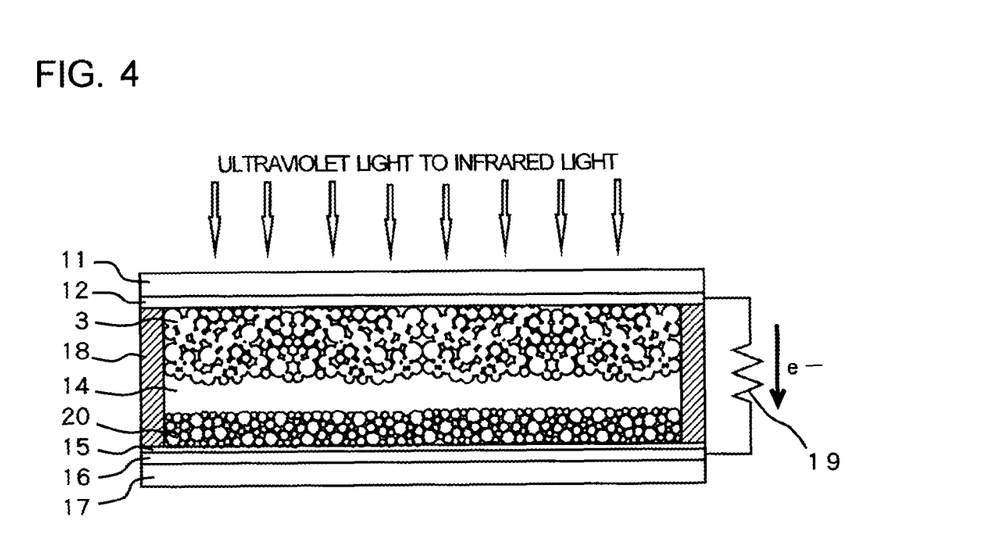
FIG. 4 shows a diagrammatic view of the solar cell according to Embodiment 2 using porous titanium dioxide and silicon dioxide.

In FIG. 4, numeral 11 represents a transparent substrate made of glass or a resin, forming on one surface thereof a transparent electrode layer 12 made of FTO or the like, which serves as an electrode on a light incident side. Numeral 3 represents a porous titanium dioxide solidified by a method, such as sintering. Numeral 14 represents an electrolytic solution, where an iodine electrolyte having iodine dissolved in an aqueous potassium iodide solution is generally used.

Numeral 20 represents synthetic quartz particles having the particle diameter of 0.2 mm or less, which are mixed with ethanol and applied onto an electrode 25 made of platinum or the like and dried.

Numeral 16 represents a transparent electrode made of FTO or the like, and numeral 17 represents a substrate made of glass or a resin. Numeral 18 represents a sealing material, and numeral 19 represents an external load.

The ultraviolet light entered from the transparent substrate 11 on the light incident side enters the porous titanium dioxide 3 to cause electric generation, and the ultraviolet light and visible light which do not contribute to the electric generation enter the silicon dioxide 20 to cause electric generation.

Thus, the solar cell according to Embodiment 2 can utilize light in the region from the ultraviolet light through the visible light in electric generation.

When the solar cell according to Embodiment 1 is irradiated with light at 1 kw/1 m2, which is a solar constant, using a solar simulator, a short-circuit current of 20 μA and an open circuit voltage of 417 mV are obtained.

Embodiment 3

Embodiment 3 is described with reference to FIG. 5.

The solar cell according to Embodiment 3 is a combination of the silicon dioxide solar cell according to Embodiment 1 and the conventional dye-sensitized titanium dioxide solar cell shown in FIG. 1(b) in a tandem configuration.

Figure 5:
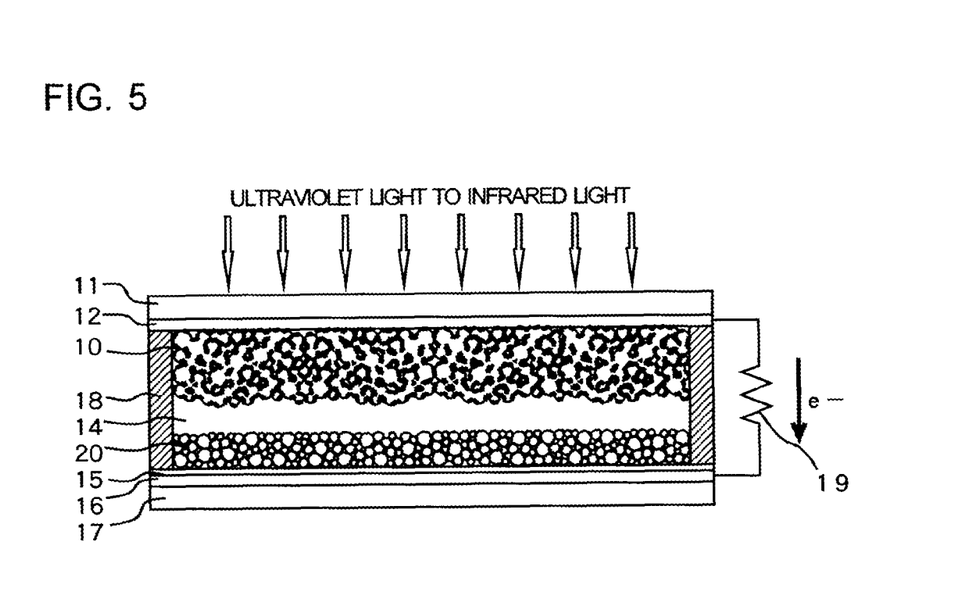
FIG. 5 shows a diagrammatic view of the solar cell according to Embodiment 3 using dye-sensitized porous titanium dioxide and silicon dioxide.

In FIG. 5, numeral 11 represents a transparent substrate made of glass or a resin, forming on one surface thereof a transparent conductive layer 12 made of FTO or the like, which serves as an electrode on a light incident side.

Numeral 10 represents a porous titanium dioxide which is solidified by a method, such as sintering, and which has adsorbed thereon a sensitizing dye, such as a ruthenium complex dye.

Numeral 14 represents an electrolytic solution, and an iodine electrolyte having iodine dissolved in an aqueous potassium iodide solution is generally used.

Numeral 20 represents pulverized synthetic quartz particles having the particle diameter of 500 nm or less, which are mixed with ethanol and applied onto an electrode 15 made of platinum or the like and dried.

Numeral 16 represents a transparent electrode made of FTO or the like, and numeral 17 represents a substrate made of glass or a resin. Numeral 18 represents a sealing material, and numeral 19 represents an external load.

Among the ultraviolet light through infrared light entered from the transparent substrate 11 on the light incident side, the ultraviolet light through visible light enters the dye-sensitized porous titanium dioxide 10 to cause electric generation, and the ultraviolet light through infrared light which does not contribute to the electric generation enters the silicon dioxide 20 to cause electric generation.

As mentioned above in connection with Embodiment 1, the silicon dioxide 20 causes electric generation using even light in the region from the visible light through the infrared light, where the titanium dioxide and sensitizing dye do not cause the electric generation.

Thus, the solar cell according to Embodiment 3 can utilize the light in all the region from the ultraviolet light through the infrared light in electric generation.

By the solar cell according to Embodiment 3, a short-circuit current of 285 μA and an open circuit voltage of 510 mV are obtained.

Figure 6:
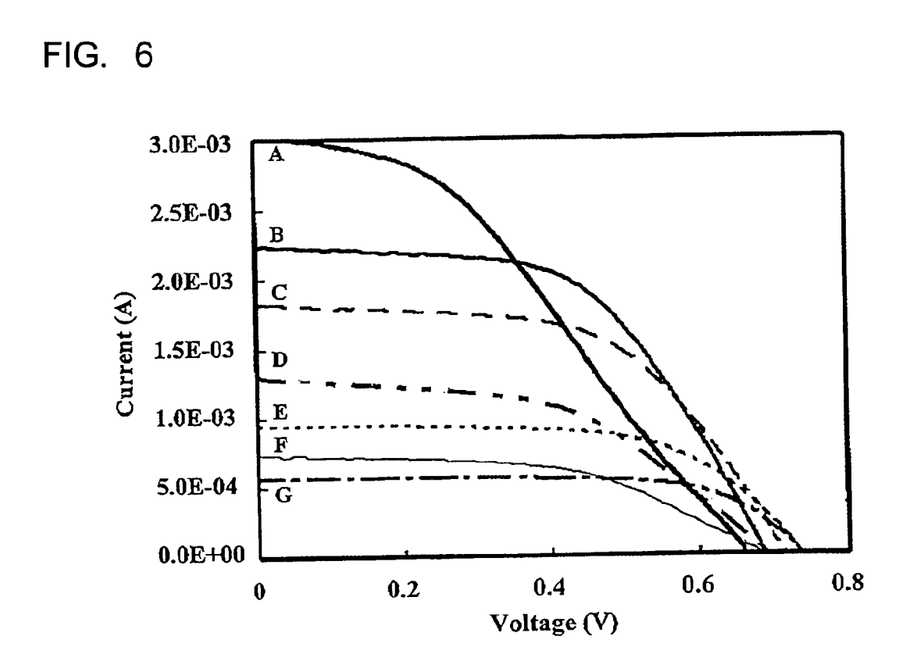
FIG. 6 shows a voltage-current characteristics graph of the dye-sensitized porous titanium dioxide solar cell according to Embodiment 3 and a conventional dye-sensitized porous titanium dioxide solar cell.

FIG. 6 shows the voltage-current characteristics of the dye sensitized solar cell when varying the silicon dioxide and the voltage-current characteristics of the conventional dye sensitized solar cell.

In FIG. 6, the voltage is taken as the abscissa, and the current is taken as the ordinate.

In the graph, for example, indication "1.0E-03" means 1.0 mA.

The characteristics are results of the measurement of a voltage and a current between the FTO electrodes using a solar simulator at the incident light energy of 1-Sun (i.e., 1 kW/m²) on the solar cell.

FIG. 6 shows voltage-current characteristics curves of 6 samples A to E and G and a conventional dye sensitized solar cell F which is a comparative sample.

Character A indicates a voltage-current characteristics curve obtained when using the synthetic quartz particles pulverized so as to have the particle diameter of 50 to 200 nm, in which the short-circuit current is 3,067 μA and the open circuit voltage is 660 mV.

Character B indicates a voltage-current characteristics curve obtained when using the synthetic quartz particles having the particle diameter of 0.2 mm, in which the short-circuit current is 2,340 μA and the open circuit voltage is 680 mV.

Character D indicates a voltage-current characteristics curve obtained when using fused quartz, in which the short-circuit current is 1,293 μA and the open circuit voltage is 680 mV.

Character C indicates a voltage-current characteristics curve obtained when using non-alkali glass, in which the short-circuit current is 1,850 μA and the open circuit voltage is 690 mV.

Character E indicates a voltage-current characteristics curve obtained when using borosilicate glass, in which the short-circuit current is 930 μA and the open circuit voltage is 700 mV.

Character F indicates a voltage-current characteristics curve of the conventional dye sensitized solar cell of FIG. 1(b), in which the short-circuit current is 733 μA and the open circuit voltage is 680 mV.

Character G indicates a voltage-current characteristics curve obtained when using soda-lime glass, in which the short-circuit current is 626 μA and the open circuit voltage is 670 mV.

As can be seen from these voltage-current characteristics curves, the dye sensitized solar cells using the silicon dioxide in A to E can extract the larger current, comparing to the conventional solar cell.

Further, even in the case using soda-lime glass which generally seems to be poorer than the conventional solar cell, in some voltage region, the solar cell can extract the larger current than that achieved by the conventional solar cell.

Embodiment 4

Figure 7:
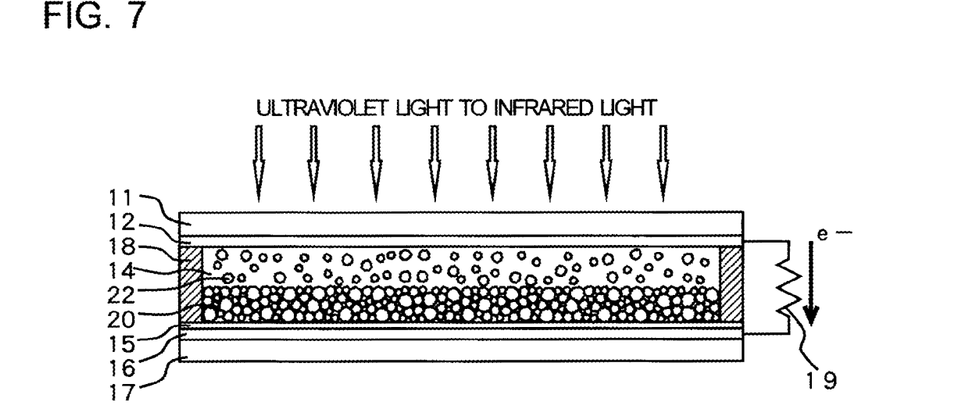
FIG. 7 shows a diagrammatic view of the arrangement of the silicon dioxide solar cell according to Embodiment 4 using pulverized silicon dioxide particles.

In Embodiment 1 shown in FIG. 3, the pulverized synthetic quartz particles to be used have the particle diameter as small as 500 nm or less, and, when the synthetic quartz particles applied onto the platinum electrode are dried and brought into contact with an electrolytic solution, the particles may be dispersed or suspended in the electrolytic solution as indicated by numeral 22 in FIG. 7.

The current-voltage relationship of the silicon dioxide solar cell is not strongly affected even in such the state.

Embodiment 5

Figure 8:
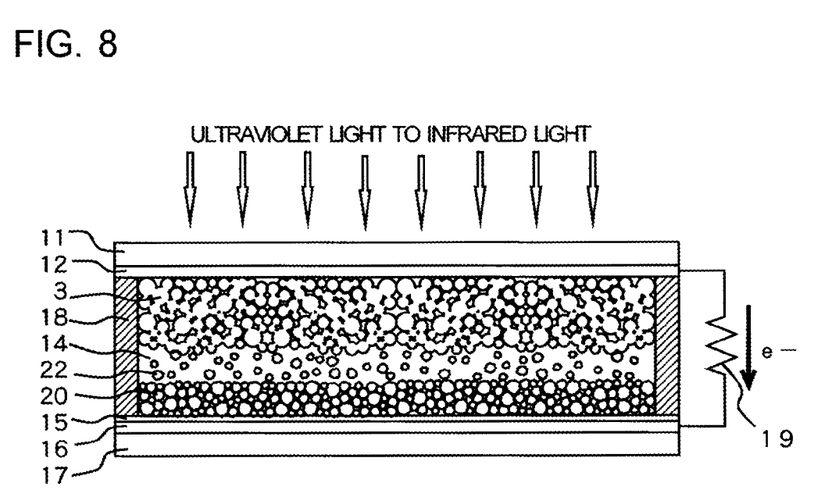
FIG. 8 shows a diagrammatic view of the arrangement of the solar cell according to Embodiment 5 using porous titanium dioxide and pulverized silicon dioxide particles.

In Embodiment 2 shown in FIG. 4, the pulverized synthetic quartz particles to be used have the particle diameter as small as 500 nm or less, and, when the synthetic quartz particles applied onto the platinum electrode are dried and brought into contact with an electrolytic solution, the particles may be dispersed or suspended in the electrolytic solution as indicated by numeral 22 in FIG. 8.

The current-voltage relationship of the silicon dioxide solar cell having a porous titanium dioxide sintered material combined is not strongly affected even in such the state.

Embodiment 6

Figure 9:
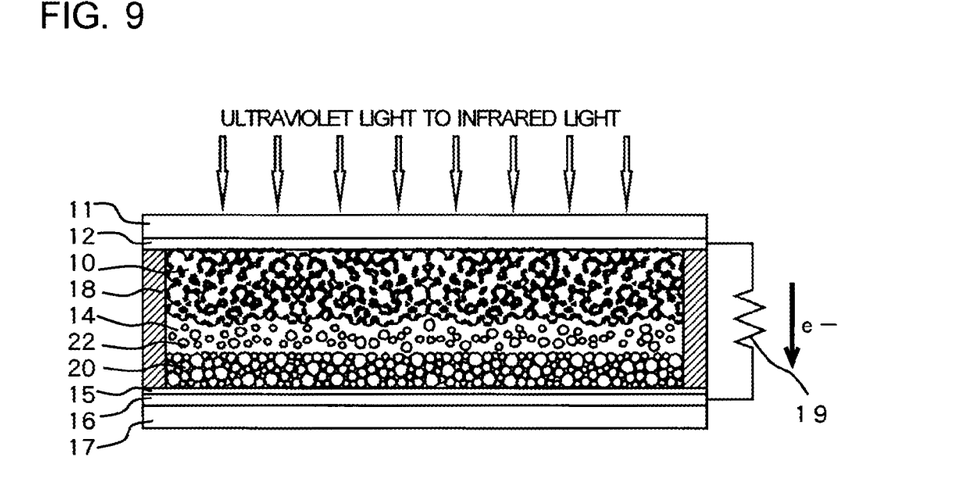
FIG. 9 shows a diagrammatic view of the arrangement of the solar cell according to Embodiment 6 using dye-sensitized porous titanium dioxide and pulverized silicon dioxide particles.

In Embodiment 3 shown in FIG. 5, the pulverized synthetic quartz particles to be used have the particle diameter as small as 500 nm or less, and, when the synthetic quartz particles applied onto the platinum electrode are dried and brought into contact with an electrolytic solution, the particles may be dispersed or suspended in the electrolytic solution as indicated by numeral 22 in FIG. 9.

The current-voltage relationship of the silicon dioxide solar cell having a dye-sensitized porous titanium dioxide sintered material combined is not strongly affected even in such the state.

Embodiment 7

Figure 10:
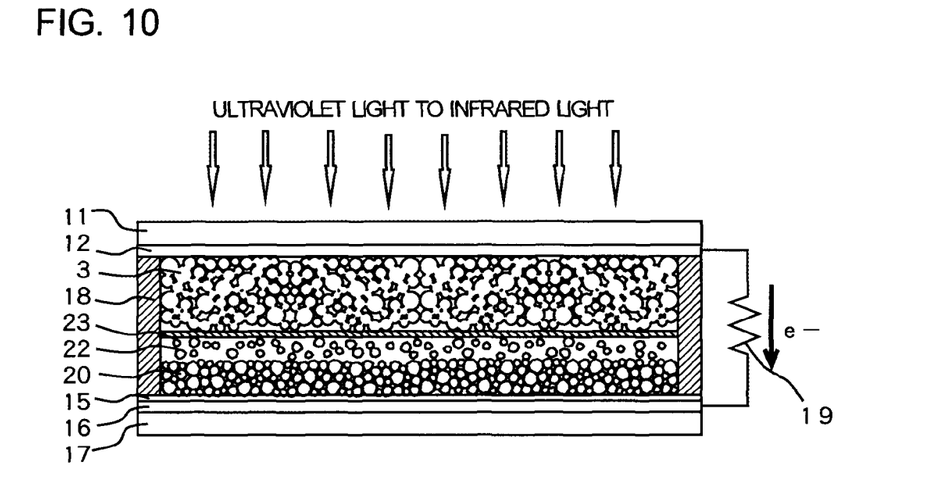
FIG. 10 shows a diagrammatic view of the arrangement of the solar cell according to Embodiment 7 using porous titanium dioxide and pulverized silicon dioxide particles.

FIG. 10 shows the silicon dioxide solar cell according to Embodiment 6 which is obtained by improving Embodiment 5.

In Embodiment 6, the pulverized synthetic quartz particles dispersed or suspended in the electrolytic solution have the particle diameter as small as 500 nm or less and are a poor conductor in essence, and therefore, may possibly penetrate into the pore portions of the porous titanium dioxide to inhibit the ability of the titanium dioxide to generate electricity.

For preventing the occurrence of such the above accident, using a separating membrane 23 permeable only for the electrolyte, the electrolyte in which the silicon dioxide 22 is suspended and the electrolyte in which the silicon dioxide 22 is not suspended are separated from each other.

Embodiment 8

Figure 11:
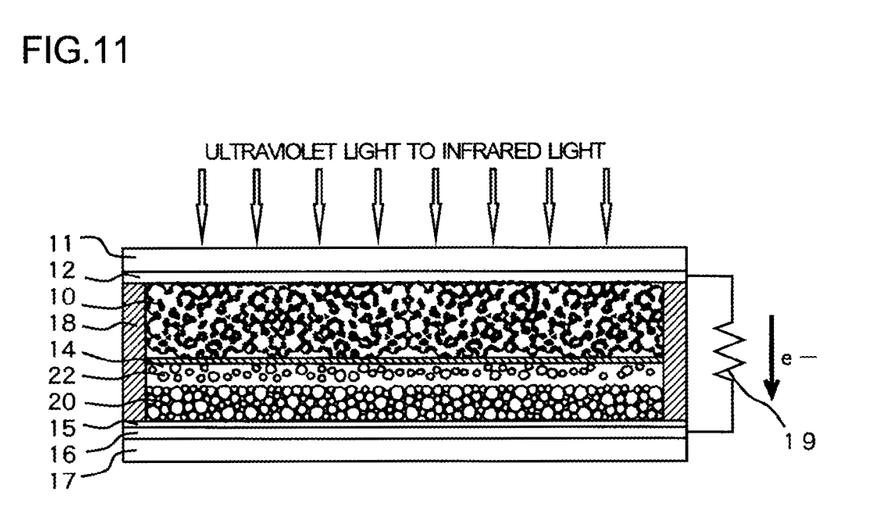
FIG. 11 shows a diagrammatic view of the arrangement of the solar cell according to Embodiment 8 using dye-sensitized porous titanium dioxide and pulverized silicon dioxide particles.

FIG. 11 shows the silicon dioxide solar cell according to Embodiment 6 which is obtained by improving Embodiment 6.

In Embodiment 6, the pulverized synthetic quartz particles dispersed or suspended in the electrolytic solution have the particle diameter as small as 500 nm or less and are a poor conductor in essence, and therefore, may possibly penetrate into the pore portions of the porous titanium dioxide to inhibit the ability of the titanium dioxide to generate electricity.

For preventing the occurrence of such the above accident, using a separating membrane 23 permeable only for the electrolyte, the electrolyte in which the silicon dioxide 22 is suspended and the electrolyte in which the silicon dioxide 22 is not suspended are separated from each other.

Embodiment 9

In the invention of the present application, with respect to the substrate, transparent conductive layer, counter electrode, electrolyte, and the like, various arrangements and materials other than those described in the aforementioned Embodiments can be used.

Hereinbelow, the arrangements and materials usable as substitutes are described.

[Substrate]

In each of the Embodiments, with respect to the container containing therein the solar cell material and electrolyte, a light transmissive material is used on the light incident side, and a light transmissive or non-transmissive material is used on the side to which no incident light enters.

As a light transmissive material, glass, plastics, amorphous silicon, or a polyester film can be used, and, as a light non-transmissive material, a metal plate of stainless steel, nickel, or the like is used.

[Transparent Conductor]

Almost all the glass and plastics used as a light transmissive material have no electrical conductivity, and, when using a material having no electrical conductivity, it is necessary to impart electrical conductivity to the material. As a light transmissive material having electrical conductivity, in addition to tin oxide, such as FTO or ITO, AZO (Al—ZN—O), a carbon material, such as carbon nanotubes or graphene, or a conductive PET film is used, and an electrode formed on a transparent material of glass, plastics, or the like is used. The transparent electrode is provided inside the solar cell.

With respect to the side of the solar cell container opposite to the light incident side, when it is required to transmit the light, a transparent electrode made of FTO, ITO, carbon nanotubes, graphene, or the like formed on a transparent material of glass, a plastic, or the like is used, and, when it is not required to transmit the light, a metal plate forming thereon a conductor for extracting charges made of carbon nanotubes, graphene, or the like is used. The conductor for extracting charges is provided inside the solar cell.

When conductive plastics is used as the plastics, the transparent conductor can be omitted.

[Silicon Dioxide Particles]

The halogen acid-treated crystalline synthetic quartz particles or amorphous glass particles are prepared as follows.

Synthetic quartz which is crystalline silicon dioxide ($SiO_2$), or glass particles of quartz glass, non-alkali glass, borosilicate glass, soda-lime, or the like, which is amorphous silicon dioxide, are immersed in an aqueous solution of hydrofluoric acid, and the resultant synthetic quartz particles or glass particles are washed with water and then dried, followed by pulverization.

Hydrochloric acid is used as halogen acid other than hydrofluoric acid, but hydrofluoric acid is preferred.

Alternatively, other halogen acid can be used.

When the silicon dioxide particles are not treated with halogen acid, a sample of the silicon dioxide particles is pulverized so that the average particle diameter of the particles becomes several 10 nm.

The treatment of the silicon dioxide particles with halogen acid can be performed after the pulverization but not before the pulverization.

[Silicon Dioxide Layer]

With respect to the silicon dioxide layer, there can be used a layer obtained by mixing synthetic quartz powder with ethanol together with platinum powder and subjecting the resultant mixture to calcination.

The silicon dioxide particle calcinated material having the particle diameter of up to about 0.5 mm can be used.

[Electrolyte]

With respect to the electrolyte, as a supporting electrolyte, various types of electrolytes, e.g., cations, such as lithium ions, or anions, such as chloride ions, are used, and, as oxidation-reduction pair present in the electrolyte, an oxidation-reduction pair, such as an iodine-iodine compound or a bromine-bromine compound, is used.

0.4 mol of 1-ethyl-3-methylimidazolium iodide, 0.4 mol of tetrabutylammonium iodide, 0.2 mol of 4-tert-butylpyridine, and 0.1 mol of guanidine isothiocyanate are dissolved in propylene carbonate liquid as a solvent to prepare an electrolyte.

When the concentration of halogen molecules in the electrolyte is 0.0004 mol/L or less, the electrolyte is almost colorless and transparent in the visible light region.

0.5 mol of lithium iodide (Lip and 0.05 mol of metallic iodine ($I_2$) are dissolved in methoxypropionitrile, and thickener is added to the resultant solution, and further 4-tert-butylpyridine is added thereto for improving the open electromotive ability and fill factor.

When the composite glass plate needs neither be colorless nor transparent, colored electrolytic solution, such as the iodine electrolytic solution, can be used.

Organic acid, such as acetic acid or citric acid, can be used as the colorless electrolyte.

[Sensitizing Dye]

By using sensitizing dye, the titanium dioxide solar cell can utilize light in the ultraviolet light and visible light region in electric generation. When the silicon dioxide solar cell satisfactorily causes electric generation using the light in the visible light region, it is not necessary to use expensive sensitizing dye having a short life.

With respect to the sensitizing dye other than the ruthenium complex dye, cobalt complex dye, porphyrin, cyanine, merocyanine, phthalocyanine, coumarin, riboflavin, xanthene, triphenylmethane, azo, quinone, C60 derivative, BTS (styryl benzothiazolium propylsulfonate), indoline, or dye derived from a plant, such as hibiscus or American cherry, can be used, and, by choosing from the dye having different electric generation properties, the light usable in the electric generation can be appropriately selected.

[Counter Electrode]

With respect to the semiconductor layer as a counter electrode, other than the zinc oxide (ZnO), titanium dioxide ($TiO_2$), copper oxide (CuO), magnesium oxide (MgO), strontium titanate ($SrTiO_3$), carbon nitride, graphene, or the like can be used.

[Surface on the Light Incident Side]

In all the Embodiments described above, the silicon dioxide calcinated material is disposed on the side to which no incident light enters. There is no absolute reason for this arrangement, and therefore the silicon dioxide calcinated material can be disposed on the side to which the incident light enters.

INDUSTRIAL APPLICABILITY

According to the invention of the present application, combining further a silicon dioxide solar cell in a tandem configuration in a titanium dioxide solar cell container, there can be obtained a solar cell which is advantageous in that it can utilize light in all the region from the ultraviolet light through the infrared light in electric generation.

REFERENCE NUMERALS 1, 7, 11, 17: Substrate
2, 6, 12, 16: Transparent conductive layer
3: Porous titanium dioxide sintered material
4, 14: Electrolyte
5, 15: Counter electrode
8, 18: Sealing material
9: External load
10: Dye-sensitized porous titanium dioxide sintered material
20: silicon dioxide particles compact
22: Silicon dioxide particles

The invention claimed is:

1. A silicon dioxide solar cell, comprising:
  first and second substrates having electrical conductivity, the first and second substrates being arranged so that conductive surfaces of the first and second substrates are facing each other, the first substrate being a transparent substrate on a light incident side to which a light is irradiated;
  a layer made of silicon dioxide particles selected from the group consisting of synthetic quartz particles, fused quartz glass particles, borosilicate glass particles, and soda-lime glass particles; and
  an electrolyte disposed between said first and second substrates,
  a porous titanium dioxide sintered material is disposed on said first substrate on the light incident side, and a separator, which is permeable for the electrolyte and which is impermeable for the silicon dioxide particles, is disposed between the porous titanium dioxide sintered material and the layer made of silicon dioxide particles,
wherein said layer made of silicon dioxide particles is disposed at an electrode on a side of the second substrate,
wherein a space between said layer made of silicon dioxide particles and said first substrate on the light incident side is filled with said electrolyte, and
wherein the silicon dioxide solar cell is configured to generate electricity from said layer made of silicon dioxide particles and output the electricity via the electrode.

2. The silicon dioxide solar cell according to claim 1, wherein the silicon dioxide particles have the particle diameter of 500 nm or less.

3. The silicon dioxide solar cell according to claim 1 or 2, wherein the silicon dioxide particles are treated with halogen acid.

4. The silicon dioxide solar cell according to claim 3, wherein the halogen acid is hydrofluoric acid.

5. The silicon dioxide solar cell according to claim 3, wherein the halogen acid is hydrochloric acid.

6. The silicon dioxide solar cell according to claim 1, wherein the porous titanium dioxide sintered material has adsorbed thereon sensitizing dye.

7. The silicon dioxide solar cell according to claim 1, wherein the silicon dioxide solar cell is configured to generate the electricity from said layer made of silicon dioxide particles in response to a light which does not contain ultraviolet.

* * * * *